(12) United States Patent
Huang

(10) Patent No.: US 12,224,288 B2
(45) Date of Patent: Feb. 11, 2025

(54) ARRAY BASE PLATE, METHOD FOR MANUFACTURING SAME, AND DISPLAY PANEL

(71) Applicants: Huizhou China Star Optoelectronics Display Co., Ltd., Huizhou (CN); TCL China Star Optoelectronics Technology Co., Ltd., Shenzhen (CN)

(72) Inventor: Jiahui Huang, Huizhou (CN)

(73) Assignees: Huizhou China Star Optoelectronics Display Co., Ltd., Huizhou (CN); TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/620,678

(22) PCT Filed: Nov. 12, 2021

(86) PCT No.: PCT/CN2021/130398
§ 371 (c)(1),
(2) Date: Dec. 18, 2021

(87) PCT Pub. No.: WO2023/070753
PCT Pub. Date: May 4, 2023

(65) Prior Publication Data
US 2024/0047465 A1 Feb. 8, 2024

(30) Foreign Application Priority Data
Oct. 26, 2021 (CN) .......................... 202111250392

(51) Int. Cl.
*H01L 27/12* (2006.01)
(52) U.S. Cl.
CPC ...... *H01L 27/1222* (2013.01); *H01L 27/1288* (2013.01)

(58) Field of Classification Search
CPC ............ H01L 27/1222; H01L 27/1288; H01L 29/78696; H01L 29/66969; H01L 29/7869; H01L 29/45; H01L 27/1225; H01L 27/127
See application file for complete search history.

(56) References Cited

U.S. PATENT DOCUMENTS

2007/0166894 A1 7/2007 Lim
2009/0020759 A1* 1/2009 Yamazaki ............. H01L 29/458
257/59
(Continued)

FOREIGN PATENT DOCUMENTS

CN 103872139 A 6/2014
CN 105097944 A 11/2015
(Continued)

OTHER PUBLICATIONS

International Search Report in International application No. PCT/CN2021/130398, mailed on Jul. 27, 2022.
(Continued)

*Primary Examiner* — Mohammed R Alam
(74) *Attorney, Agent, or Firm* — PV IP PC; Wei Te Chung

(57) ABSTRACT

An array base plate, a method for manufacturing same, and a display panel are disclosed. The array base plate includes: an active layer including a body portion, and a first conduction portion and a second conduction portion disposed on two sides of the active layer; an etching protective layer and an ohmic contact layer disposed in a same layer, where the etching protective layer is located on the body portion, and the ohmic contact layer is located on the first conduction portion and the second conduction portion; and a source and
(Continued)

a drain separately disposed on the ohmic contact layer located on the first conduction portion and the second conduction portion.

6 Claims, 2 Drawing Sheets

(56) References Cited

U.S. PATENT DOCUMENTS

| | | | | |
|---|---|---|---|---|
| 2015/0008426 A1* | 1/2015 | Cho | ................... | H01L 27/1288 |
| | | | | 438/34 |
| 2017/0170309 A1* | 6/2017 | Liu | ................... | H01L 29/78618 |
| 2018/0196294 A1* | 7/2018 | Ishida | ............... | G02F 1/136286 |

FOREIGN PATENT DOCUMENTS

| | | |
|---|---|---|
| CN | 105140271 A | 12/2015 |
| CN | 109148303 A | 1/2019 |

OTHER PUBLICATIONS

Written Opinion of the International Search Authority in International application No. PCT/CN2021/130398, mailed on Jul. 27, 2022.

\* cited by examiner

ARRAY BASE PLATE, METHOD FOR MANUFACTURING SAME, AND DISPLAY PANEL

CROSS-REFERENCE TO RELATED APPLICATION

This application is a national phase application under 35 U.S.C. § 371 of PCT Application No. PCT/CN2021/130398, filed Nov. 12, 2021, which claims priority to Chinese Application No. 202111250392.3, filed Oct. 26, 2021, the contents of which are incorporated herein by reference in their entirety.

BACKGROUND

Technical Field

This application relates to the field of display technologies, and in particular, to an array base plate, a method for manufacturing same, and a display panel.

Related Art

Due to high mobility, adequate uniformity, adequate permeability for visible light, and low-temperature manufacturing process, an amorphous oxide thin film transistor is widely used in various display drivers. An amorphous oxide semiconductor is an important material of an active layer in a thin film transistor. Due to a high carrier concentration and a strong charge transport capability, the amorphous oxide semiconductor can effectively drive a thin film transistor device. However, in the manufacturing process of the device, a film layer needs to be etched. A body portion of the active layer may be damaged during etching of a film layer adjacent to the active layer, affecting the conductivity and stability of the thin film transistor.

Technical Problem

Embodiments of this application provide an array base plate, a method for manufacturing same, and a display panel, to resolve a problem that a body portion of an active layer is damaged in a manufacturing process of an array base plate.

SUMMARY

Technical Solution

This application provides an array base plate, comprising:
a substrate;
an active layer disposed on the substrate;
an etching protective layer and an ohmic contact layer, wherein the etching protective layer and the ohmic contact layer are disposed in a same layer, the etching protective layer is located on a body portion of the active layer, and the ohmic contact layer is located on a first conduction portion and a second conduction portion of the active layer;
a source disposed on the ohmic contact layer located on the first conduction portion of the active layer; and
a drain disposed on the ohmic contact layer located on the second conduction portion of the active layer.

Optionally, in some embodiments of this application, the active layer comprises an active portion and a protective portion sequentially disposed in a stacked manner, and a mobility of the active portion is greater than a mobility of the protective portion.

Optionally, in some embodiments of this application, a material of the ohmic contact layer comprises a conductive material, and a material of the etching protective layer comprises an oxide of the conductive material.

Optionally, in some embodiments of this application, the material of the ohmic contact layer comprises one or a combination of more than one of Si, Mo, Al, Ti, or Cu, and the material of the etching protective layer comprises one or a combination of more than one of silicon nitride, molybdenum oxide, aluminum oxide, titanium oxide, or copper oxide.

Optionally, in some embodiments of this application, a material of the ohmic contact layer comprises a metal or metal oxide, and a material of the etching protective layer comprises an Si-based insulating material.

Optionally, in some embodiments of this application, the material of the ohmic contact layer comprises one or a combination of more than one of Si, ITO, Mo, Al, Ti, or Cu, and the material of the etching protective layer comprises one or a combination of more than one of silicon nitride, silicon oxynitride, or silicon oxide.

Optionally, in some embodiments of this application, the array base plate further comprises a gate, a first gate insulating layer, and a second gate insulating layer, the gate is disposed on the substrate, the first gate insulating layer is disposed on the substrate and the gate, the second gate insulating layer is disposed on the first gate insulating layer, and the active layer is disposed on the second gate insulating layer, and is located above the gate.

Optionally, in some embodiments of this application, the array base plate further comprises a first protective layer, a second protective layer, a passivation layer, and a pixel electrode; the first protective layer is disposed on the etching protective layer, the source, the drain, and the second gate insulating layer; the second protective layer, the passivation layer, and the pixel electrode are sequentially disposed on the first protective layer in a stacked manner; and the pixel electrode is connected to the drain.

Correspondingly, this application further provides a method for manufacturing an array base plate, including following steps:
providing a substrate;
forming an active layer on the substrate;
forming an etching protective layer on a body portion of the active layer, and forming an ohmic contact layer on a first conduction portion and a second conduction portion of the active layer; and
forming a source on the ohmic contact layer located on the first conduction portion of the active layer, and forming a drain on the ohmic contact layer located on the second conduction portion of the active layer.

Optionally, in some embodiments of this application, the step of forming an etching protective layer on a body portion of the active layer, and forming an ohmic contact layer on a first conduction portion and a second conduction portion of the active layer comprises following steps:
arranging a conductive material on the active layer, and patterning the conductive material, so that the conductive material located on the body portion of the active layer forms the etching protective layer, and the conductive material located on the first conduction portion and the second conduction portion of the active layer forms the ohmic contact layer.

Optionally, in some embodiments of this application, a source is formed on the ohmic contact layer located on the first conduction portion of the active layer, and a drain is formed on the ohmic contact layer located on the second conduction portion of the active layer.

Optionally, in some embodiments of this application, a material of the ohmic contact layer comprises a conductive material, and a material of the etching protective layer comprises an oxide of the conductive material.

Optionally, in some embodiments of this application, the material of the ohmic contact layer comprises one or a combination of more than one of Si, Mo, Al, Ti, or Cu, and the material of the etching protective layer comprises one or a combination of more than one of silicon nitride, molybdenum oxide, aluminum oxide, titanium oxide, or copper oxide.

Optionally, in some embodiments of this application, a material of the ohmic contact layer comprises a metal or metal oxide, and a material of the etching protective layer comprises an Si-based insulating material.

Optionally, in some embodiments of this application, the material of the ohmic contact layer comprises one or a combination of more than one of Si, ITO, Mo, Al, Ti, or Cu, and the material of the etching protective layer comprises one or a combination of more than one of silicon nitride, silicon oxynitride, or silicon oxide.

Optionally, in some embodiments of this application, after the providing a substrate, and before the forming an active layer on the substrate, the method further comprises following steps:
forming a gate on the substrate;
forming a first gate insulating layer on the substrate and the gate; and
forming a second gate insulating layer on the first gate insulating layer.

Optionally, in some embodiments of this application, after the forming a source on the ohmic contact layer located on the first conduction portion of the active layer, and forming a drain on the ohmic contact layer located on the second conduction portion of the active layer, the method further comprises following steps:
forming a first protective layer on the second gate insulating layer, the source, the drain, and the etching protective layer;
sequentially forming a second protective layer and a passivation layer on the first protective layer in a stacked manner; and
forming a pixel electrode on the passivation layer, wherein the pixel electrode is connected to the drain.

Optionally, in some embodiments of this application, the forming an active layer on the substrate comprises:
sequentially arranging an active portion and a protective portion of the active layer on the substrate in a stacked manner, wherein a mobility of the active portion is greater than a mobility of the protective portion.

Optionally, in some embodiments of this application, a material of the active portion comprises an oxide of at least one element of indium (In) or tin (Sn) as a main component, and is doped with an oxide of one or more elements of gallium (Ga), lanthanum (La), praseodymium (Pr), neodymium (Nd), promethium (Pm), samarium (Sm), or europium (Eu), and a material of the protective portion comprises an oxide of one or more elements of Ga, La, In, Pr, Nd, Pm, Sm, or Eu.

Correspondingly, this application further provides a display panel, and the display panel includes the array base plate according to the foregoing descriptions.

Beneficial Effects

This application discloses an array base plate, a method for manufacturing same, and a display panel. The array base plate includes: a substrate, an active layer, an etching protective layer, an ohmic contact layer, a source, and a drain, where the active layer is disposed on the substrate, the etching protective layer and the ohmic contact layer are disposed in a same layer, the etching protective layer is located on a body portion of the active layer, and the ohmic contact layer is located on a first conduction portion and a second conduction portion of the active layer, the source is disposed on the ohmic contact layer located on the first conduction portion of the active layer, and the drain is disposed on the ohmic contact layer located on the second conduction portion of the active layer. In this application, the etching protective layer formed by an insulating material is disposed on the body portion of the active layer, to prevent the body portion of the active layer from being damaged when a film layer is subsequently etched; and the etching protective layer is oxidized by using a rapid oxidation technology to form an insulated etching protective layer, so that oxygen can be supplemented to the lower active layer, to control an oxygen vacancy concentration, and in addition, the switching performance of a transistor is ensured, and the stability and conductivity of the array base plate are improved, thereby improving the performance of the array base plate. The etching protective layer and the ohmic contact layer are disposed in the same layer on the active layer, so that the array base plate can be formed by using only four photomasks, thereby simplifying the manufacturing process and reducing the cost.

BRIEF DESCRIPTION OF THE DRAWINGS

To describe the technical solutions in the embodiments of this application more clearly, the following briefly describes accompanying drawings required for describing the embodiments. Apparently, the accompanying drawings in the following description show merely some embodiments of this application, and a person skilled in the art may still derive other drawings from these accompanying drawings without creative efforts.

DETAILED DESCRIPTION

The technical solutions in the embodiments of this application are clearly and completely described in the following with reference to the accompanying drawings in the embodiments of this application. Apparently, the described embodiments are merely some rather than all of the embodiments of this application. All other embodiments obtained by a person skilled in the art based on the embodiments of this application without creative efforts shall fall within the protection scope of this application. In addition, it should be understood that the specific implementations described herein are merely used for describing and illustrating this application rather than limiting this application. In this application, without the contrary explanation, directional terms such as "upper" and "lower" used herein generally refer to upper and lower in actual use or operation of the device, and specifically, to surface directions shown in the accompanying drawings; and "inner" and "outer" refer to inside and outside of a contour of a component. In this application, "reaction" may be a chemical reaction or a physical reaction.

The embodiments of this application provide an array base plate, a method for manufacturing same, and a display panel. The array base plate includes a substrate, an active layer, an etching protective layer, a source, and a drain. The active layer is disposed on the substrate. The etching protective layer is disposed on a body portion of the active layer. The source is disposed on a first conduction portion of the active layer. The drain is disposed on a second conduction portion of the active layer.

In this application, the etching protective layer formed by an insulating material is disposed on the body portion of the active layer, to prevent the body portion of the active layer from being damaged when a film layer is subsequently etched, and ensure the switching performance of a transistor, thereby improving the conductivity and stability of the array base plate, and improving the performance of the array base plate.

Detailed descriptions are separately provided below.

Figure 1:
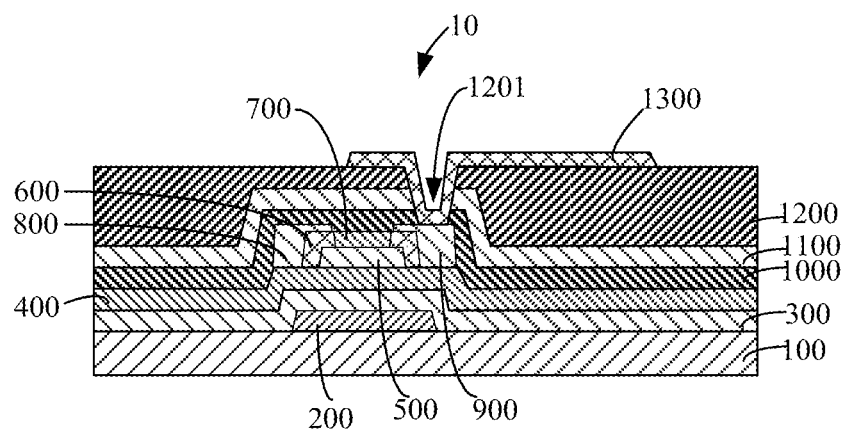
FIG. 1 is a first schematic structural diagram of an array base plate according to an embodiment of this application.

FIG. 1 shows a first schematic structural diagram of an array base plate according to an embodiment of this application. This application provides an array base plate. In this embodiment, descriptions are only made by using a transistor with a bottom-gate structure as an example. An array base plate 10 includes a substrate 100, a gate 200, a first gate insulating layer 300, a second gate insulating layer 400, an active layer 500, an ohmic contact layer 600, an etching protective layer 700, a source 800, a drain 900, a first protective layer 1000, a second protective layer 1100, a passivation layer 1200, and a pixel electrode 1300.

The gate 200 is disposed on the substrate 100. A material of the gate 200 includes one or a combination of more than one of Mo, Al, Ti, and Cu.

The first gate insulating layer 300 and the second gate insulating layer 400 are sequentially disposed on the substrate 100 and the gate 200 in a stacked manner. Both a material of the first gate insulating layer 300 and a material of the second gate insulating layer 400 include one or a combination of more than one of silicon nitride, silicon oxynitride, or silicon oxide. In this embodiment, the material of the first gate insulating layer 300 is silicon nitride, and the material of the second gate insulating layer 400 is silicon oxide.

The active layer 500 is disposed on the second gate insulating layer 400. The active layer 500 includes a body portion and a first conduction portion and a second conduction portion that are disposed on the body portion. The active layer 500 is an oxide active layer 500. A material of the active layer 500 includes at least one of zinc tin oxide (ZnO), indium tin zinc oxide (ITZO), indium tin zinc tin oxide (ITZTO), indium tin oxide (ITO), zinc tin oxide (ZTO), and indium gallium zinc oxide (IGZO). In this embodiment, the material of the active layer 500 is IGZO.

The etching protective layer 700 is disposed on the body portion of the active layer 500. The ohmic contact layer 600 is disposed on the first conduction portion of the active layer 500 and the second conduction portion of the active layer 500. A material of the ohmic contact layer 600 is a conductive material. The material of the ohmic contact layer 600 includes a conductive material, and a material of the etching protective layer 700 includes an oxide of the conductive material. Specifically, the material of the ohmic contact layer 600 includes one or a combination of more than one of Si, Mo, Al, Ti, or Cu, and the material of the etching protective layer 700 includes one or a combination of more than one of silicon nitride, molybdenum oxide, aluminum oxide, titanium oxide, or copper oxide. For example, when the material of the ohmic contact layer 600 is Si, the material of the etching protective layer 700 may be silicon oxide. Alternatively, when the material of the ohmic contact layer 600 is Ti, the material of the etching protective layer 700 may be titanium oxide. Alternatively, when the material of the ohmic contact layer 600 is Cu, the material of the etching protective layer 700 may be copper oxide. In this embodiment, the material of the ohmic contact layer 600 is N-type Si. In this embodiment, the material of the etching protective layer 700 is silicon oxide. The etching protective layer 700 is made of the oxide of the conductive material, so that oxygen may be supplemented to the active layer 500, to control an oxygen vacancy concentration, and improve the stability of the array base plate 10.

In another embodiment, the material of the ohmic contact layer 600 includes a metal or metal oxide, and the material of the etching protective layer 700 includes an Si-based insulating material. Specifically, the material of the ohmic contact layer 600 includes one or a combination of more than one of Si, ITO, Mo, Al, Ti, or Cu, and the material of the etching protective layer 700 includes one or a combination of more than one of silicon nitride, silicon oxynitride, or silicon oxide. For example, when the material of the ohmic contact layer 600 is ITO, the material of the etching protective layer 700 may be silicon oxynitride. Alternatively, when the material of the ohmic contact layer 600 is Si, the material of the etching protective layer 700 may be silicon nitride or the like.

The source 800 is disposed on the ohmic contact layer 600 on the first conduction portion of the active layer 500. The drain 900 is disposed on the ohmic contact layer 600 on the second conduction portion of the active layer 500. Both the source 800 and the drain 900 are in contact with the etching protective layer 700.

The first protective layer 1000 covers the second gate insulating layer 400, the etching protective layer 700, the source 800, and the drain 900. The second protective layer 1100 covers the first protective layer 1000. Both a material of the first protective layer 1000 and a material of the second protective layer 1100 include one or a combination of more than one of silicon nitride, silicon oxynitride, or silicon oxide. In this embodiment, the material of the first protective layer 1000 is silicon nitride, and the material of the second protective layer 1100 is silicon oxide.

The passivation layer 1200 is disposed on the second protective layer 1100. A through hole 1201 is provided in the passivation layer 1200. The through hole 1201 penetrates the passivation layer 1200, the first protective layer 1000, and the second protective layer 1100 to expose the drain 900.

The pixel electrode 1300 is disposed on the passivation layer 1200, and extends into the through hole 1201 to be connected to the drain 900.

In this application, the etching protective layer 700 is disposed on the body portion of the active layer 500, to prevent an etching solution of the source 800 and the drain 900 from damaging the body portion of the active layer 500 in a process of forming the source 800 and the drain 900, thereby improving the conductivity and stability of the array base plate 10, and then improving the performance of the array base plate 10. The etching protective layer 700 is made of the oxide of the conductive material, and oxygen may be supplemented to the active layer 500, to control an oxygen vacancy concentration, and in addition, the switching performance of a transistor is ensured, thereby improving the stability of the array base plate 10. The etching protective layer 700 and the ohmic contact layer 600 are disposed in the same layer on the active layer 500, to prevent the etching solution of the source 800 and the drain 900 from damaging the body portion of the active layer 500, and improve contact between the active layer 500 and the source 800 and the drain 900, thereby improving the conductivity of the array base plate 10, and simplifying the manufacturing process.

Figure 2:
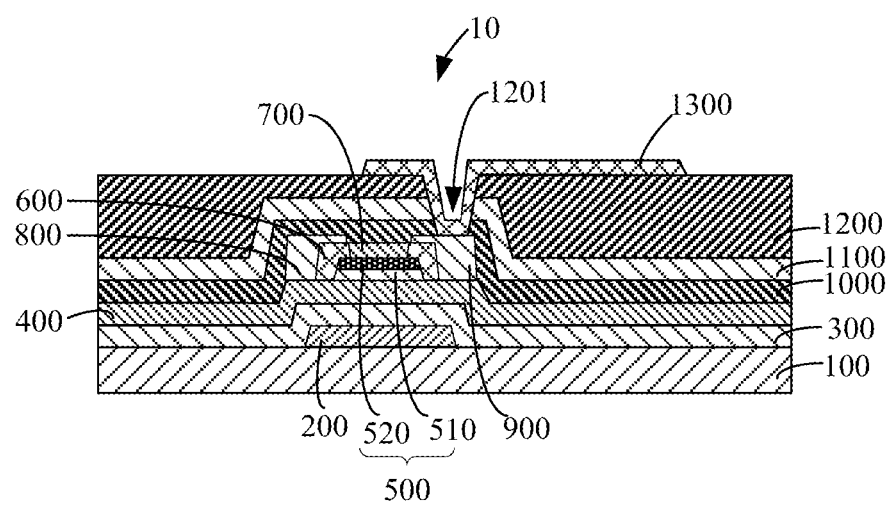
FIG. 2 is a second schematic structural diagram of an array base plate according to an embodiment of this application.

FIG. 2 shows a second schematic structural diagram of an array base plate 10 according to an embodiment of this application. Differences between the second structure and the first structure are as follows:

An active layer 500 includes an active portion 510 and a protective portion 520 sequentially disposed on a substrate 100 in a stacked manner. A mobility of the active portion 510 is greater than a mobility of the protective portion 520. A material of the active portion 510 includes an oxide of at least one element of indium (In) or tin (Sn) as a main component, and is doped with an oxide of one or more elements of gallium (Ga), lanthanum (La), praseodymium (Pr), neodymium (Nd), promethium (Pm), samarium (Sm), or europium (Eu). A material of the protective portion 520 includes an oxide of one or more elements of Ga, La, In, Pr, Nd, Pm, Sm, or Eu.

In this application, the active portion 510 and the protective portion 520 form the active layer 500, and the mobility of the protective portion 520 is set to be less than the mobility of the active portion 510, so that the protective portion may be reused as the etching protective layer, thereby further preventing the body portion of the active layer 500 from being damaged when a source 800 and a drain 900 are subsequently etched, and then further improving performance of the array base plate 10.

Figure 3:
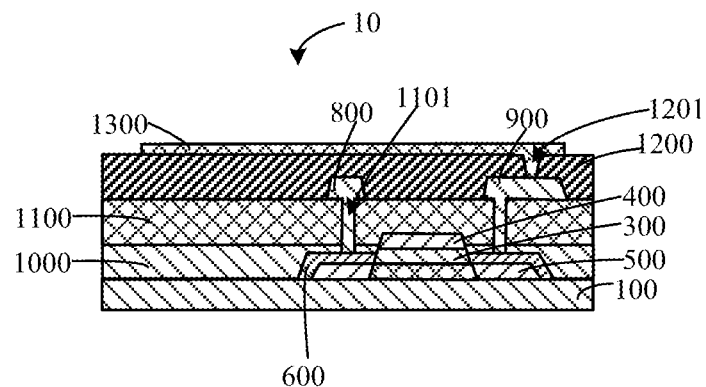
FIG. 3 is a third schematic structural diagram of an array base plate according to an embodiment of this application.

FIG. 3 shows a third schematic structural diagram of an array base plate 10 according to an embodiment of this application. Differences between the third structure and the first structure are as follows:

A first gate insulating layer 300 and a gate 200 are not disposed between a substrate 100 and an active layer 500, and a second gate insulating layer, a first protective layer, and a second protective layer are not provided. The first gate insulating layer 300 and the gate 200 are sequentially disposed on an etching protective layer 700 in a stacked manner, and a source 800 and a drain 900 are disposed on a second protective layer 1100, and are connected to an ohmic contact layer 600 through a connection hole 1101 of the second protective layer 1100. That is, in this embodiment, descriptions are only made by using a transistor with a top-gate structure as an example.

In this application, the etching protective layer 700 is disposed on a body portion of the active layer 500, to prevent an adopted etching solution from damaging the body portion of the active layer 500 in a subsequent process of forming the first gate insulating layer 300, thereby improving the performance of the array base plate 10.

This application further provides a display panel. The display panel includes the array base plate 10 provided in this application.

This application further provides a method for manufacturing an array base plate 10, including the following steps:

B11: Provide a substrate.

B12: Form an active layer on the substrate.

B13: Form an etching protective layer on a body portion of the active layer.

B14: Form a source on a first conduction portion of the active layer, and form a drain on a second conduction portion of the active layer.

In this application, an etching protective layer 700 is formed on a body portion of an active layer 500, to prevent an etching solution from damaging the body portion of the active layer 500 in a subsequent etching process of a film layer, thereby improving the performance of the array base plate 10.

Detailed descriptions are provided below.

Embodiment 1

Figure 4:
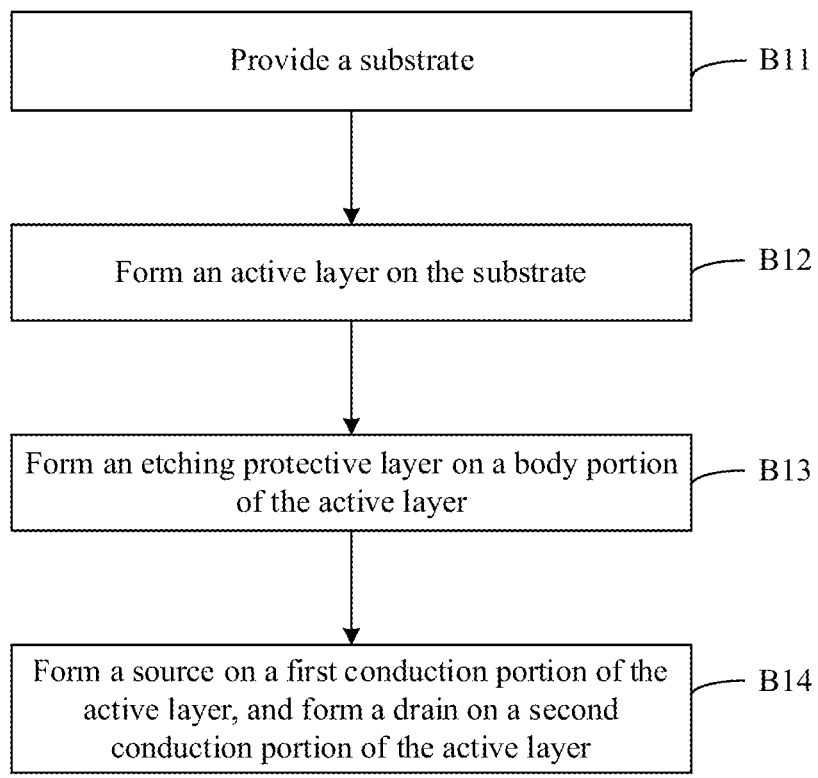
FIG. 4 is a schematic flowchart of a method for manufacturing an array base plate according to an embodiment of this application.

Referring to FIG. 1 and FIG. 4, FIG. 4 is a schematic flowchart of a method for manufacturing an array base plate according to an embodiment of this application.

B11: Provide a substrate.

A material of the gate 200 is disposed on a substrate 100, and the material is patterned to form the gate 200. The material of the gate 200 includes one or a combination of more than one of Mo, Al, Ti, or Cu. In this embodiment, the material of the gate 200 is Al.

A first gate insulating layer 300 and a second gate insulating layer 400 are sequentially formed on the substrate 100 in a stacked manner. Both a material of the first gate insulating layer 300 and a material of the second gate insulating layer 400 include one or a combination of more than one of silicon nitride, silicon oxynitride, or silicon oxide. In this embodiment, the material of the first gate insulating layer 300 is silicon nitride, and the material of the second gate insulating layer 400 is silicon oxide.

B12: Form an active layer on the substrate.

A material of an active layer 500 is disposed on the second gate insulating layer 400, and the material is patterned to form the active layer 500. The active layer 500 includes a body portion and a first conduction portion and a second conduction portion that are disposed on the body portion. The active layer 500 is an oxide active layer 500. A material of the active layer 500 includes at least one of zinc tin oxide (ZnO), indium tin zinc oxide (ITZO), indium tin zinc tin oxide (ITZTO), indium tin oxide (ITO), zinc tin oxide (ZTO), and indium gallium zinc oxide (IGZO). In this embodiment, the material of the active layer 500 is IGZO.

B13: Form an etching protective layer on a body portion of the active layer, and form an ohmic contact layer on a first conduction portion and a second conduction portion of the active layer.

A conductive material is disposed on the active layer 500 and the second gate insulating layer 400, and the conductive material is patterned, so that the conductive material located on the first conduction portion and the second conduction portion of the active layer 500 forms an ohmic contact layer 600, and the conductive material located on the body portion of the active layer 500 forms an etching protective layer 700. The conductive material includes one or a combination of more than one of Si, ITO, Mo, Al, Ti, or Cu. In this embodiment, descriptions are only made by using an example in which the conductive material is N-type Si.

B14: Form a source on the ohmic contact layer located on the first conduction portion of the active layer, and form a drain on the ohmic contact layer located on the second conduction portion of the active layer.

Materials of a source 800 and a drain 900 are disposed on the second gate insulating layer 400 and the ohmic contact layer 600. The materials of the source 800 and the drain 900 are etched by using copper acid, and then the source 800 located on the first conduction portion of the active layer 500 and the drain 900 located on the second conduction portion of the active layer 500 are formed.

After the source 800 and the drain 900 are formed through the etching, under the condition of retaining the photoresist, the N-type Si on the body portion of the active layer 500 is treated with a strong oxidizing mixture of nitric acid and sulfuric acid to be oxidized into $SiO_2$, thereby forming an insulated etching protective layer 700.

In another embodiment, after the source 800 and the drain 900 are formed, under the condition of retaining the photoresist, a strong oxidizing gas is introduced, and the N-type Si is oxidized into $SiO_2$ under the plasma condition, thereby forming the insulated etching protective layer 700. The strong oxidizing gas includes one or a combination of more than one of $N_2O$, $NO_2$, $O_2$, and $O_3$.

In this embodiment, a material of the ohmic contact layer 600 includes a conductive material, and a material of the etching protective layer includes an oxide of the conductive material.

Specifically, the material of the ohmic contact layer includes one or a combination of more than one of Si, Mo, Al, Ti, or Cu, and the material of the etching protective layer includes one or a combination of more than one of silicon nitride, molybdenum oxide, aluminum oxide, titanium oxide, or copper oxide.

A first protective layer 1000, a second protective layer 1100, and a passivation layer 1200 are sequentially formed on the second gate insulating layer 400, the source 800, the drain 900, and the etching protective layer 700 in a stacked manner. A through hole 1201 is provided in the passivation layer 1200. The through hole 1201 penetrates the passivation layer 1200, the first protective layer 1000, and the second protective layer 1100 to expose the drain 900.

A pixel electrode 1300 is formed on the passivation layer 1200, and extends into the through hole 1201 to be connected to the drain 900.

In this application, the etching protective layer 700 is disposed on the body portion of the active layer 500, to prevent the body portion of the active layer 500 from being damaged. The etching protective layer 700 is oxidized by using a rapid oxidation technology to form the insulated etching protective layer 700, so that oxygen can be supplemented to the lower active layer 500, to control an oxygen vacancy concentration, and in addition, the switching performance of a transistor is ensured, and the stability and conductivity of the array base plate 10 are improved, thereby improving the performance of the array base plate 10. The etching protective layer 700 and the ohmic contact layer 600 are disposed in the same layer on the active layer 500, so that the array base plate 10 can be formed by using only four photomasks, thereby simplifying the manufacturing process and reducing the cost.

Embodiment 2

Still referring to FIG. 1, it should be noted that, differences between Embodiment 2 and Embodiment 1 are as follows:

After the step of forming an active layer 500, a material of an etching protective layer 700 is first disposed on the active layer 500, and the material of the etching protective layer 700 may be an oxide of a conductive material, for example, silicon nitride. Then, the oxide of the conductive material is patterned to form the etching protective layer 700. Next, the conductive material, for example, Si, is disposed to form an ohmic contact layer 600. Alternatively, a material of the ohmic contact layer 600 is a metal or metal oxide, and the material of the etching protective layer 700 is an Si-based insulating material. For example, when the material of the ohmic contact layer 600 is ITO, the material of the etching protective layer 700 may be silicon oxynitride. Alternatively, when the material of the ohmic contact layer 600 is Si, the material of the etching protective layer 700 may be silicon nitride. Other steps are the same as those of Embodiment 1, which are not described herein again.

This application provides an array base plate 10, a method for manufacturing same, and a display panel. The etching protective layer 700 is disposed on the body portion of the active layer 500, to prevent an etching solution of the source 800 and the drain 900 from damaging the body portion of the active layer 500 in a process of forming the source 800 and the drain 900, thereby improving the conductivity and stability of the array base plate 10, and then improving the performance of the array base plate 10. The etching protective layer 700 and the ohmic contact layer 600 are disposed in the same layer on the active layer 500, to prevent an etching solution of the source 800 and the drain 900 or an etching solution of the first gate insulating layer 300 from damaging the body portion of the active layer 500, and improve contact between the active layer 500 and the source 800 and the drain 900, thereby improving the conductivity of the array base plate 10. In addition, the array base plate 10 can be formed by using only four photomasks, thereby simplifying the manufacturing process and reducing the cost.

The array base plate, the method for manufacturing same, and the display panel provided in the embodiments of this application are described in detail above. The principle and implementations of this application are described herein by using specific examples. The descriptions of the above embodiments are merely used for helping understand the method and core ideas of this application. Meanwhile, a person of ordinary skill in the art may make modifications to the specific implementations and application scopes according to the ideas of this application. In conclusion, the content of the specification should not be construed as a limitation to this application.

What is claimed is:

1. An array base plate, comprising:
   a substrate;
   an active layer disposed on the substrate;
   an etching protective layer and an ohmic contact layer, wherein the etching protective layer and the ohmic contact layer are disposed in a same layer, the etching protective layer is located on a body portion of the active layer, and the ohmic contact layer is located on a first conduction portion and a second conduction portion of the active layer;
   a source disposed on the ohmic contact layer located on the first conduction portion of the active layer; and
   a drain disposed on the ohmic contact layer located on the second conduction portion of the active layer;
   wherein a material of the ohmic contact layer comprises a metal or metal oxide, and a material of the etching protective layer comprises an Si-based insulating material.

2. The array base plate according to claim 1, wherein the active layer comprises an active portion and a protective portion sequentially disposed in a stacked manner, and a mobility of the active portion is greater than a mobility of the protective portion.

3. The array base plate according to claim 1, wherein the material of the ohmic contact layer comprises one or a combination of more than one of Si, ITO, Mo, Al, Ti, or Cu, and the material of the etching protective layer comprises one or a combination of more than one of silicon nitride, silicon oxynitride, or silicon oxide.

4. The array base plate according to claim 1, wherein the array base plate further comprises a gate, a first gate insulating layer, and a second gate insulating layer, the gate is disposed on the substrate, the first gate insulating layer is disposed on the substrate and the gate, the second gate insulating layer is disposed on the first gate insulating layer, and the active layer is disposed on the second gate insulating layer, and is located above the gate.

5. The array base plate according to claim 4, wherein the array base plate further comprises a first protective layer, a second protective layer, a passivation layer, and a pixel electrode; the first protective layer is disposed on the etching protective layer, the source, the drain, and the second gate insulating layer; the second protective layer, the passivation layer, and the pixel electrode are sequentially disposed on the first protective layer in a stacked manner; and the pixel electrode is connected to the drain.

6. A display panel, comprising an array base plate according to claim 1.

* * * * *